United States Patent
Wu

(10) Patent No.: US 10,424,583 B2
(45) Date of Patent: *Sep. 24, 2019

(54) METHODS OF OPERATING A MEMORY DEVICE

(71) Applicant: Micron Technology, Inc., Boise, ID (US)

(72) Inventor: Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/027,598

(22) Filed: Jul. 5, 2018

(65) Prior Publication Data

US 2018/0331110 A1 Nov. 15, 2018

Related U.S. Application Data

(63) Continuation of application No. 15/671,471, filed on Aug. 8, 2017, now Pat. No. 10,020,310, which is a continuation of application No. 14/848,357, filed on Sep. 9, 2015, now Pat. No. 9,735,161.

(51) Int. Cl.
| | |
|---|---|
| *H01L 21/336* | (2006.01) |
| *H01L 27/108* | (2006.01) |
| *H01L 27/11582* | (2017.01) |
| *H01L 49/02* | (2006.01) |

(52) U.S. Cl.
CPC .. *H01L 27/10823* (2013.01); *H01L 27/10876* (2013.01); *H01L 27/11582* (2013.01); *H01L 28/00* (2013.01)

(58) Field of Classification Search
CPC .................................................. H01L 27/10876
USPC ........ 257/135, 302, 330; 438/242, 258, 270, 438/589
See application file for complete search history.

(56) References Cited

U.S. PATENT DOCUMENTS

| | | | |
|---|---|---|---|
| 6,395,597 B2 | 5/2002 | Noble | |
| 6,479,366 B2 | 11/2002 | Miyamoto | |
| 6,531,377 B2 | 3/2003 | Knorr et al. | |
| 7,557,002 B2 | 7/2009 | Wells et al. | |
| 7,713,823 B2 | 5/2010 | Sung et al. | |

(Continued)

FOREIGN PATENT DOCUMENTS

| | | |
|---|---|---|
| CN | 102903622 A | 1/2013 |
| CN | 103579849 A | 2/2014 |

(Continued)

OTHER PUBLICATIONS

Chinese Office Action and Search Report from Chinese Application No. 201610015683.7, dated Dec. 4, 2018, 9 pages.

(Continued)

*Primary Examiner* — Calvin Lee
(74) *Attorney, Agent, or Firm* — TraskBritt

(57) ABSTRACT

A memory device and a method for fabricating the same are provided. The memory device includes a substrate, a first active region, a second active region, a gate structure, and a capping layer. The first active region and the second active region are alternately disposed in the substrate. The gate structure is disposed in the substrate and between the first active region and the second active region. The capping layer is over the gate structure to define a void therebetween.

20 Claims, 10 Drawing Sheets

(56) References Cited

U.S. PATENT DOCUMENTS

| | | |
|---|---|---|
| 8,105,902 B2 | 1/2012 | Shin |
| 8,222,110 B2 | 7/2012 | Kim et al. |
| 8,552,472 B2 | 10/2013 | Kim et al. |
| 8,618,597 B2 | 12/2013 | Aritome |
| 9,735,161 B2 * | 8/2017 | Wu .................. H01L 27/10823 257/302 |
| 10,020,310 B2 * | 7/2018 | Wu .................. H01L 27/10823 438/270 |
| 2002/0179966 A1 | 12/2002 | Yang et al. |
| 2008/0003743 A1 | 1/2008 | Lee |
| 2011/0073930 A1 | 3/2011 | Choi et al. |
| 2014/0061757 A1 | 3/2014 | Kim et al. |
| 2014/0252434 A1 | 9/2014 | Lee et al. |
| 2017/0069632 A1 | 3/2017 | Wu |
| 2017/0358583 A1 | 12/2017 | Wu |

FOREIGN PATENT DOCUMENTS

| | | |
|---|---|---|
| TW | I380398 | 12/2012 |
| TW | 201434153 A | 9/2014 |

OTHER PUBLICATIONS

Chinese Office Action and Search Report from Chinese Application No. 201810968346.9, dated May 20, 2019, 11 pages.

\* cited by examiner

METHODS OF OPERATING A MEMORY DEVICE

CROSS-REFERENCE TO RELATED APPLICATIONS

This application is a continuation of U.S. patent application Ser. No. 15/671,471, filed Aug. 8, 2017, now U.S. Pat. No. 10,020,310, issued Jul. 10, 2018 which is a continuation of U.S. patent application Ser. No. 14/848,357, filed Sep. 9, 2015, now U.S. Pat. No. 9,735,161, issued Aug. 15, 2017, the disclosure of each of which is hereby incorporated herein in its entirety by this reference.

BACKGROUND

Description of Related Art

A Dynamic Random Access Memory (DRAM) is an essential element in many electronic products. To increase component density and improve overall performance of DRAM, industrial manufacturers make constant efforts to reduce the sizes of transistors for the DRAM. However, as the transistor size is reduced, the device performance of such DRAM is still not satisfactory in advanced applications of technology.

Accordingly, an improved memory device and a fabricating method thereof are required.

SUMMARY

An aspect of the present disclosure provides a memory device. The memory device includes a substrate, a first active region, a second active region, a gate structure, and capping layer. The first active region and the second active region are alternately disposed in the substrate. The gate structure is disposed in the substrate and between the first active region and the second active region. The capping layer is over the gate structure to define a void therebetween.

In various embodiments of the present disclosure, the gate structure is a single-layer structure or a multi-layer structure.

In various embodiments of the present disclosure, the gate structure is a multi-layer structure including a first portion and a second portion embedded in the first portion.

In various embodiments of the present disclosure, the void contains a gaseous material.

In various embodiments of the present disclosure, the gaseous material has a dielectric constant of about 1.

In various embodiments of the present disclosure, the void is a vacuum.

In various embodiments of the present disclosure, the capping layer is made of oxide.

In various embodiments of the present disclosure, the capping layer includes a first part and a second part interposing the first part.

In various embodiments of the present disclosure, the first part of the capping layer is made of oxide, and the second part of the capping layer is made of nitride.

In various embodiments of the present disclosure, the memory device further includes a nitride layer over the capping layer.

Another aspect of the present disclosure provides a method for fabricating a memory device, and the method includes the following steps. A first active region and a second active region are alternately formed in a substrate. A gate structure is formed in the substrate and between the first active region and the second active region. A capping layer is formed over the gate structure to define a void therebetween.

In various embodiments of the present disclosure, forming the gate structure includes the following steps. A first portion is formed. A second portion is formed, which is embedded in the first portion.

In various embodiments of the present disclosure, forming the capping layer is to seal a space between the gate structure and the capping layer to define the void.

In various embodiments of the present disclosure, the capping layer is made of oxide.

In various embodiments of the present disclosure, forming the capping layer to define the void includes the following steps. A sacrificial structure is formed over the gate structure. A first part of the capping layer is formed over the sacrificial structure, and the first part of the capping layer has an opening. The sacrificial structure is removed. A second part of the capping layer is formed in the opening to form the capping layer and define the void.

In various embodiments of the present disclosure, forming the first part of the capping layer includes the following steps. A capping liner is deposited over the sacrificial structure. The capping liner is etched to form the first part of the capping layer having the opening.

In various embodiments of the present disclosure, the sacrificial structure is made of nitride or photoresist.

In various embodiments of the present disclosure, removing the sacrificial structure is performed by wet etching or photoresist stripping.

In various embodiments of the present disclosure, the first part of the capping layer is made of oxide, and the second part of the capping layer is made of nitride.

In various embodiments of the present disclosure, the method further includes depositing a nitride layer over the capping layer.

These and other features, aspects, and advantages of the present disclosure will become better understood with reference to the following description and appended claims.

It is to be understood that both the foregoing general description and the following detailed description are by way of example, and are intended to provide further explanation of the invention as claimed.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1A:
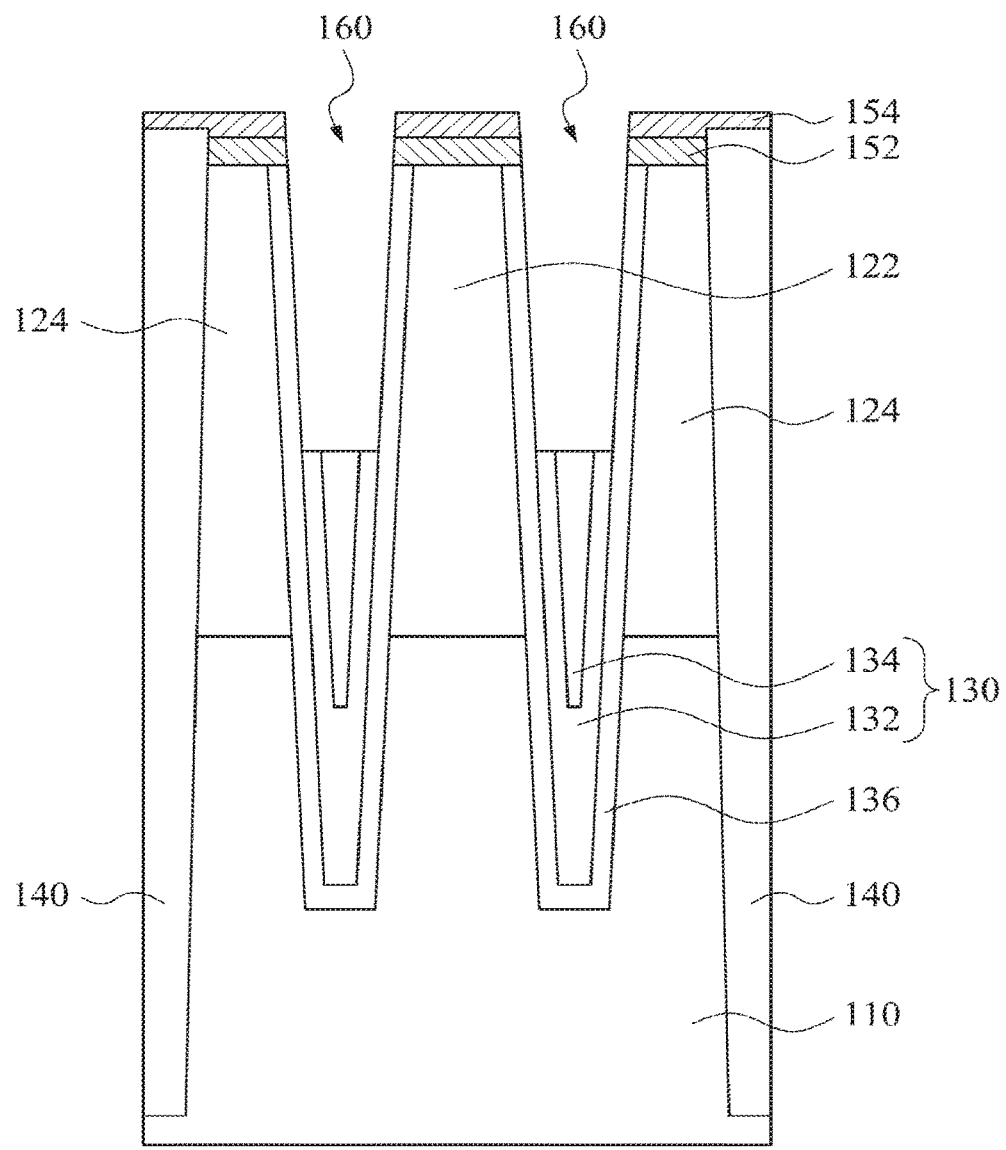
FIGS. 1A through 1D are cross-sectional views at various stages of fabricating a memory device in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As aforementioned problems, requirements in a memory device are becoming more challenging. For instance, the voltage difference between different active regions of a memory device becomes crucial as the device sizes decrease. Particularly, the different active regions are connected to different elements, and thus the different active regions have different electrical potentials. The memory cell junction would get electrical potential coupling from the active region having a lower potential. The low-field coupling from the active region would cause an electrical field increase in the cell junction and degrade gate-induced drain leakage (GIDL) performance, which inevitably degrades the performance of the memory device.

The present disclosure provides a memory device and a fabricating method thereof. The memory device of the present disclosure applies a void above a gate structure, and a first active region and a second active region. Therefore, the problems caused by the voltage difference can be alleviated, thereby improving the performance of the memory device.

FIGS. 1A through 1D are cross-sectional views at various stages of fabricating a memory device 100 in accordance with various embodiments of the present disclosure. FIGS. 1A through 1D are discussed collectively with the understanding that not all reference numerals are in all figures.

Figure 1B:
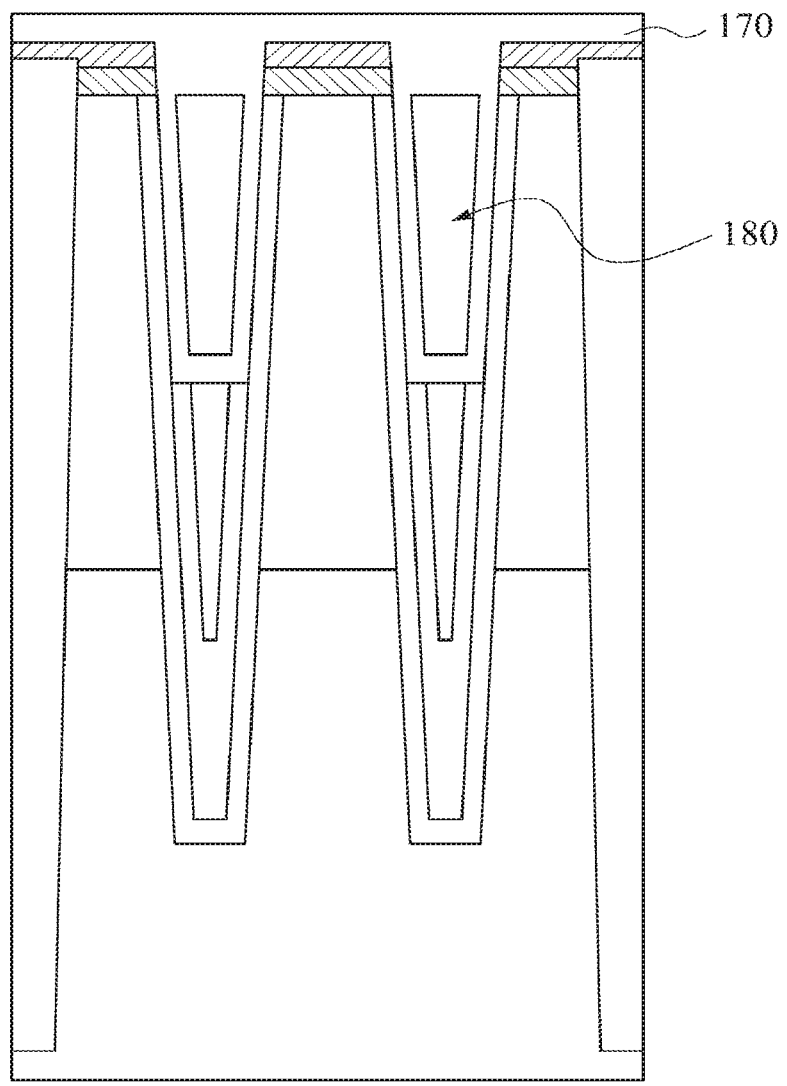
Figure 1C:
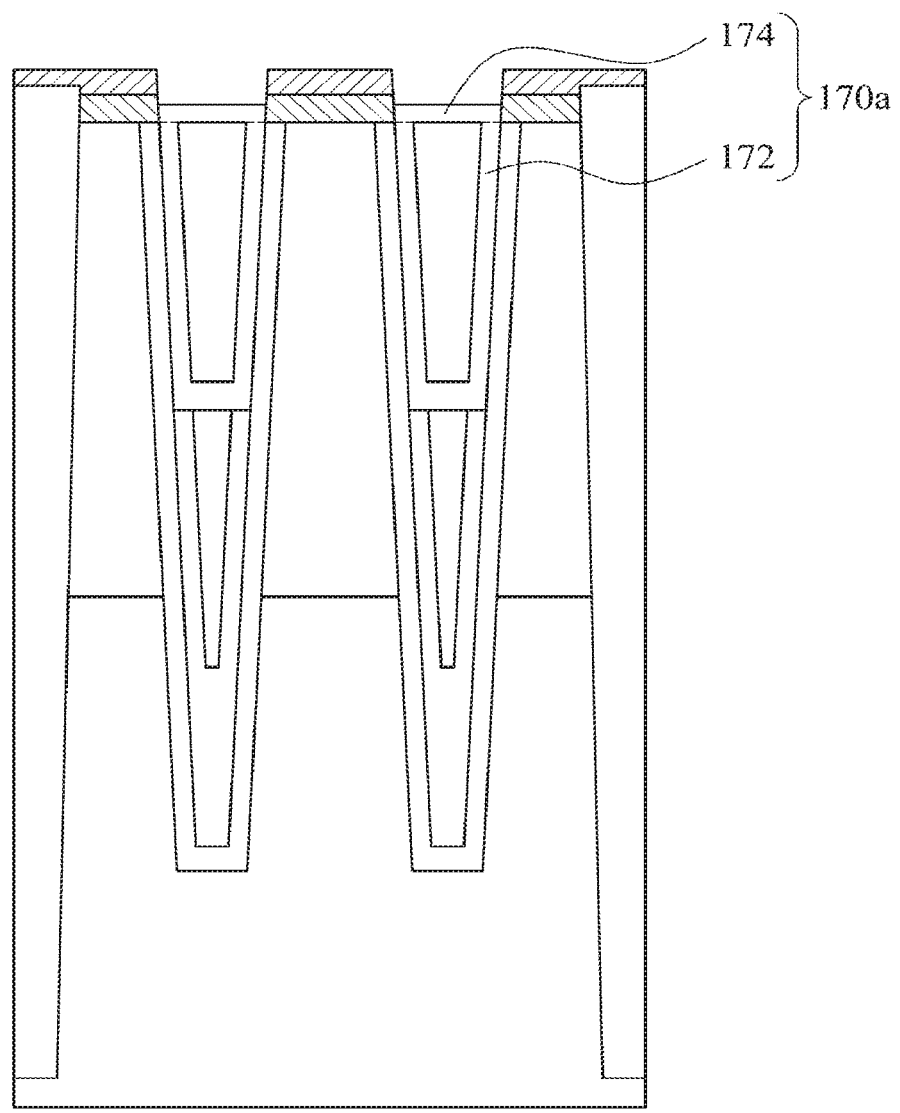
Figure 1D:
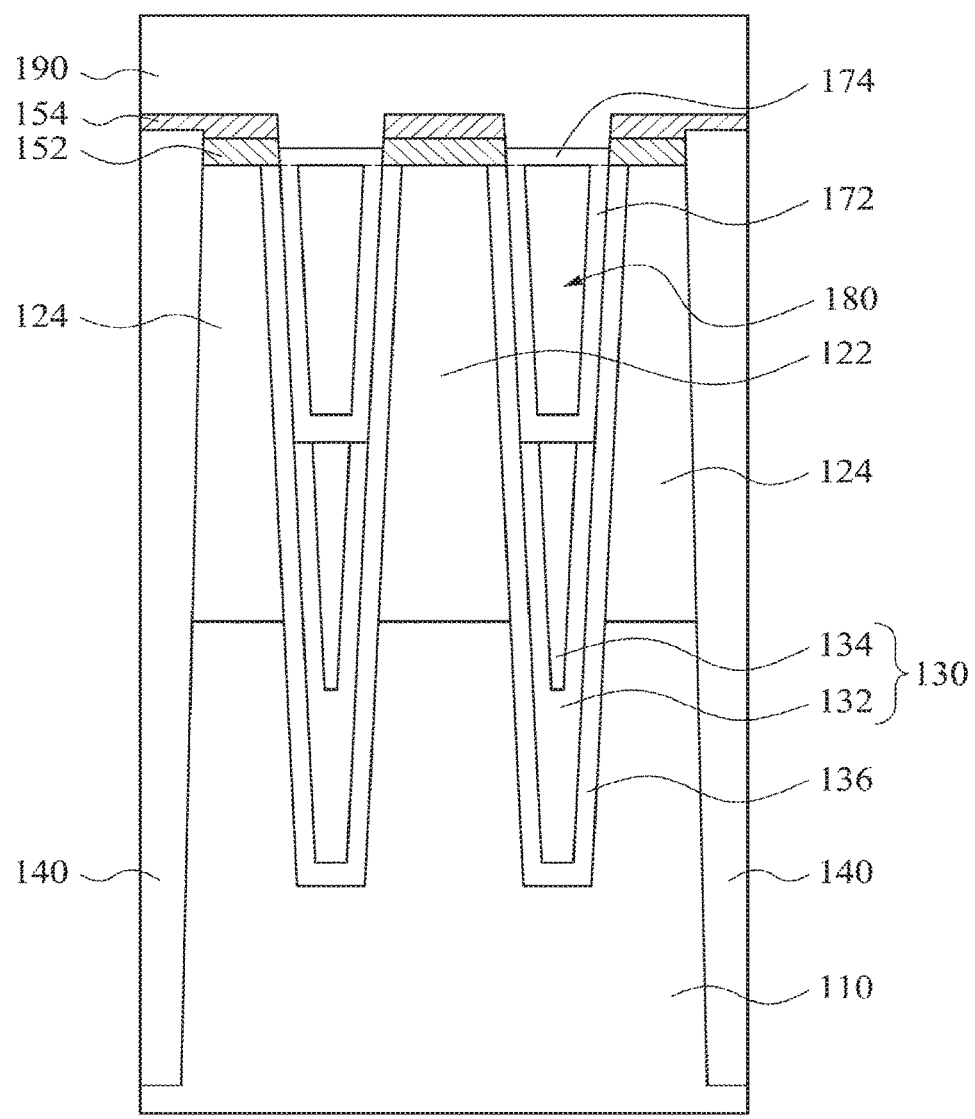

Referring to FIG. 1A, a substrate 110 is first provided for the fabrication of the memory device 100 (see FIG. 1D). A first active region 122 and second active regions 124 are formed alternately in the substrate 110, and gate structures 130 are formed in the substrate 110 and between the first active region 122 and the second active regions 124. Isolation structures 140 are formed in the substrate 110, and the first active region 122, the second active regions 124, and the gate structures 130 are disposed between two of the isolation structures 140.

The substrate 110 may be a silicon substrate, a silicon/germanium (SiGe) substrate, an epi-substrate, a silicon-on-insulator (SOI) substrate, etc.

The first active region 122 and the second active regions 124 may be formed by doping, such as n-doping or p-doping, depending on actual requirements. The first active region 122 and the second active regions 124 may respectively function as a source and a drain of the memory device 100, or vice versa. The first active region 122 and the second active regions 124 may be formed before or after the gate structures 130.

The gate structure 130 may be a single-layer structure or a multi-layer structure. For instance, the gate structure 130 includes a first portion 132 and a second portion 134 embedded in the first portion 132 as shown in FIG. 1A. The first portion 132 and the second portion 134 of the gate structure 130 may be independently made of tungsten (W), titanium nitride (TiN), tantalum nitride (TaN), tungsten nitride (WN), ruthenium (Ru), molybdenum nitride (MoN), TaN/TiN, WN/TiN, arsenic (As) doped polycrystalline silicon, tantalum (Ta), aluminum (Al), titanium (Ti), zirconium nitride (ZrN), or a combination thereof. In some embodiments, the first portion 132 is made of titanium nitride, and the second portion 134 is made of tungsten.

It is noteworthy that the gate structures 130 are disposed in the substrate 110, and thus the memory device 100 in the abovementioned embodiments can be called a "recess access device" (RAD). When a bias is applied to the gate structure 130, a channel may be formed in the substrate 110 and around the gate structure 130. Current may flow between the first active region 122 and the second active regions 124 through the channel.

In some embodiments, the gate structures 130 are formed by forming trenches in the substrate 110. Then, the first portions 132 and the second portions 134 of the gate structures 130 are formed by deposition in the bottom portions of the trenches. Accordingly, top surfaces of the gate structures 130 are lower than a top surface of the substrate 110. Unfilled portions of the trenches over the gate structures 130 are referred to as recesses 160 hereafter.

The memory device 100 applies a dual-gate system as shown in FIG. 1A, in which a memory cell of the memory device includes two gate structures, one first active region, and two second active regions. An isolation structure is disposed between two adjacent memory cells. The first active region is between the gate structures, and the second active regions are between the gate structures and the isolation structures.

In some embodiments, a gate dielectric layer 136 is formed between the gate structure 130 and the first active region 122 and between the gate structure 130 and the second active regions 124. The gate dielectric layer 136 may be formed by deposition before forming the gate structure 130. The material of the gate dielectric layer 136 may be any suitable dielectric material, such as oxide or nitride.

The isolation structures 140 may be shallow trench isolation (STI) structures. The isolation structures 140 may be disposed in the substrate 110 and between two adjacent memory cells to provide electrical isolation. In some embodiments, the isolation structures 140 are made of dielectric materials, such as silicon oxide or other suitable materials.

In some embodiments, a first oxide layer 152 and a second oxide layer 154 are deposited over the substrate 110 as shown in FIG. 1A. The first oxide layer 152 and the second oxide layer 154 function as dielectric layers.

Continuing in FIG. 1B, a top oxide 170 is formed on the sidewalls of the recesses 160 and over the gate structures 130. The recesses 160 are thus sealed to leave voids 180 over the gate structures 130.

The top oxide 170 may be formed by any suitable deposition process. Examples of the deposition process include, but are not limited to, chemical vapor deposition (CVD), physical vapor deposition (PVD), atomic layer deposition (ALD), and a combination thereof. A chemical-mechanical planarization (CMP) process may be optionally performed after the deposition.

The void 180 is not filled with any solid material. In some embodiments, the void 180 is a vacuum. In other embodiments, the void 180 contains a gaseous material. The gaseous material may be nitrogen, oxygen, air, or a mixture thereof. The air may be dry air, which represents air with no water vapor or having a low relative humidity (usually about 40%). It is noteworthy that the gaseous material within the voids 180 has a low dielectric constant (k). In some embodiments, the gaseous material has a dielectric constant of about 1. In contrast, a general memory device uses dielectric material to fill the space above a gate structure for isolation. The dielectric material usually has high dielectric constant, such as oxide (k is about 3.9) and nitride (k is about 7 to about 8), which may cause electrical potential coupling, resulting in leakage current. The memory device 100 applies the voids 180 between the first active region 122 and the second active regions 124, and over the gate structures 130 as caps, the voids 180 having a lower dielectric constant. Hence, the electrical potential coupling can be reduced so as to prevent leakage current, thereby improving the performance of the memory device 100.

It is noteworthy that the gate structures 130 are sealed so as to leave the voids 180 thereon. This is because the deposition rate of the material of the top oxide 170 is faster at corners of the recesses 160, and the materials at the corners are bridged before the bottom of the recesses 160 are filled. That is, the openings of the recesses 160 are sealed to form the voids 180, which are the space between the bridged top oxide and the gate structures 130, which are sealed.

Referring to FIG. 1C, the top oxide 170 is etched to form an etched top oxide 170a, and each of which includes a liner 172 on the sidewalls of the recess 160 and a capping layer 174 over the gate structure 130 and bridging the sidewalls of the recess 160. The liner 172 and the capping layer 174 are defined by a dotted line as shown in FIG. 1C.

It is noteworthy that other methods can be applied to form voids over a gate structure. For instance, the capping layer may be directly formed over the gate structure without the liner to bridge sidewalls of the recesses and leave voids between the capping layer and the gate structure.

Referring to FIG. 1D, a nitride layer 190 is deposited over the capping layer 174 and the second oxide layer 154, and the memory device 100 is thereby formed. The nitride layer 190 may be formed by any suitable deposition process, such as those exemplified above. A CMP process may be optionally performed after the deposition. In some embodiments, the nitride layer 190 is made of silicon nitride (SiN).

The formed memory device 100, in accordance with various embodiments of the present disclosure, includes the substrate 110, the first active region 122, the second active regions 124, the gate structures 130, the isolation structures 140, the first oxide layer 152, the second oxide layer 154, the liners 172, the capping layers 174, the voids 180, and the nitride layer 190. The first active region 122 and the second active regions 124 are alternately disposed in the substrate 110. The gate structures 130 are disposed in the substrate 110 and between the first active region 122 and the second active regions 124. The isolation structures 140 are disposed in the substrate 110, and the first active region 122, the second active regions 124, and the gate structures 130 are disposed between two of the isolation structures 140. The first oxide layer 152 and the second oxide layer 154 are disposed over the substrate 110. The liners 172 and the capping layers 174 are integrally formed, and are over gate structures 130. The voids 180 are defined by the capping layers 174 and the gate structures 130, and are the space therebetween. The nitride layer 190 is disposed over the capping layers 174 and the second oxide layer 154.

The memory device of the present disclosure applies a novel structure, which includes the void over the gate structure for isolation. The void may be a vacuum, or may include low-k gaseous material, and is disposed between the first active region and the second active regions of the memory device. As a result, the electrical potential coupling can be reduced, thereby improving the performance of the memory device. Further, the void provides better stress relax function than a structure filled with solid material.

FIGS. 2A through 2F are cross-sectional views at various stages of fabricating a memory device 200 in accordance with various embodiments of the present disclosure. FIGS. 2A through 2F are discussed collectively with the understanding that not all reference numerals are in all figures.

Figure 2A:
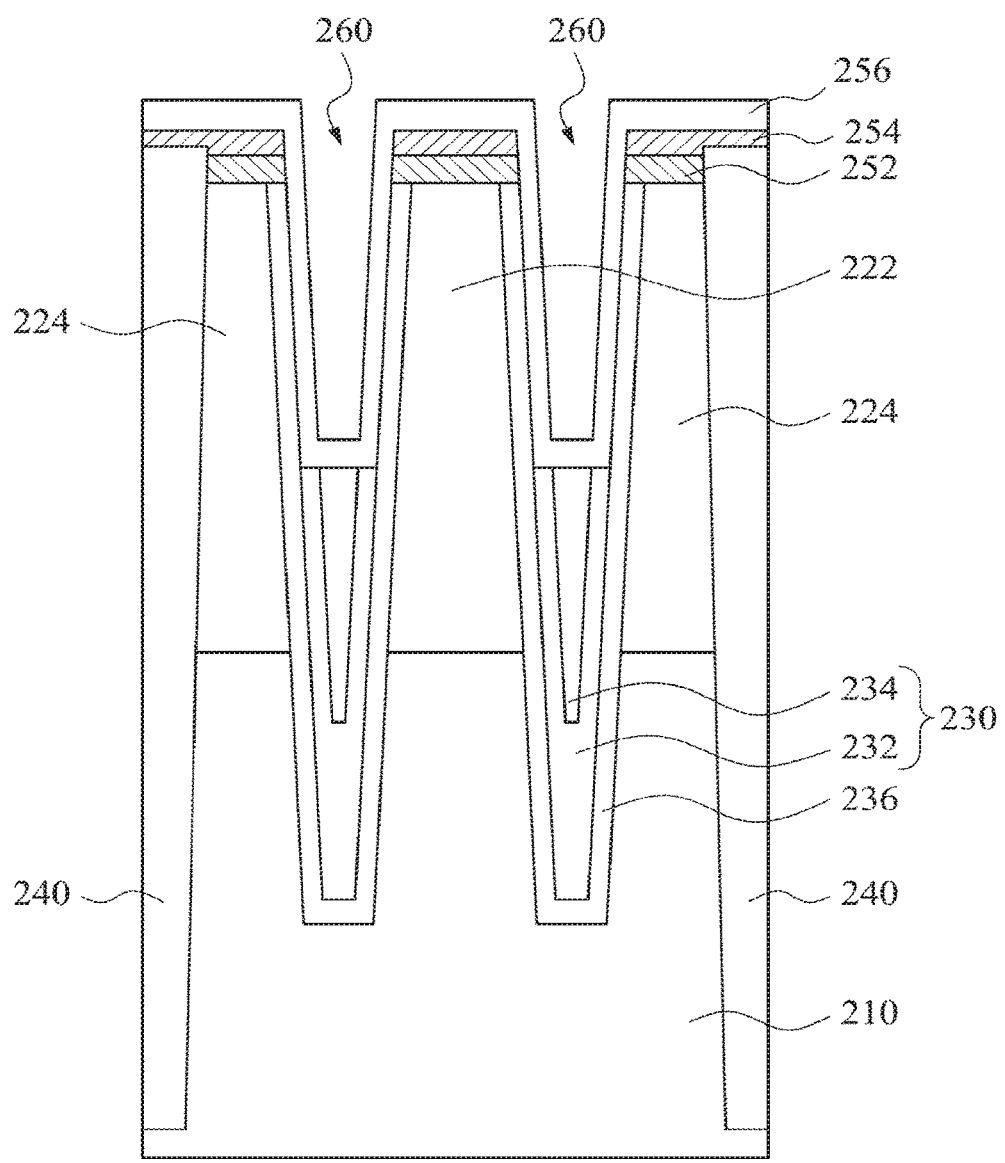
FIGS. 2A through 2F are cross-sectional views at various stages of fabricating a memory device in accordance with various embodiments of the present disclosure.
Figure 2B:
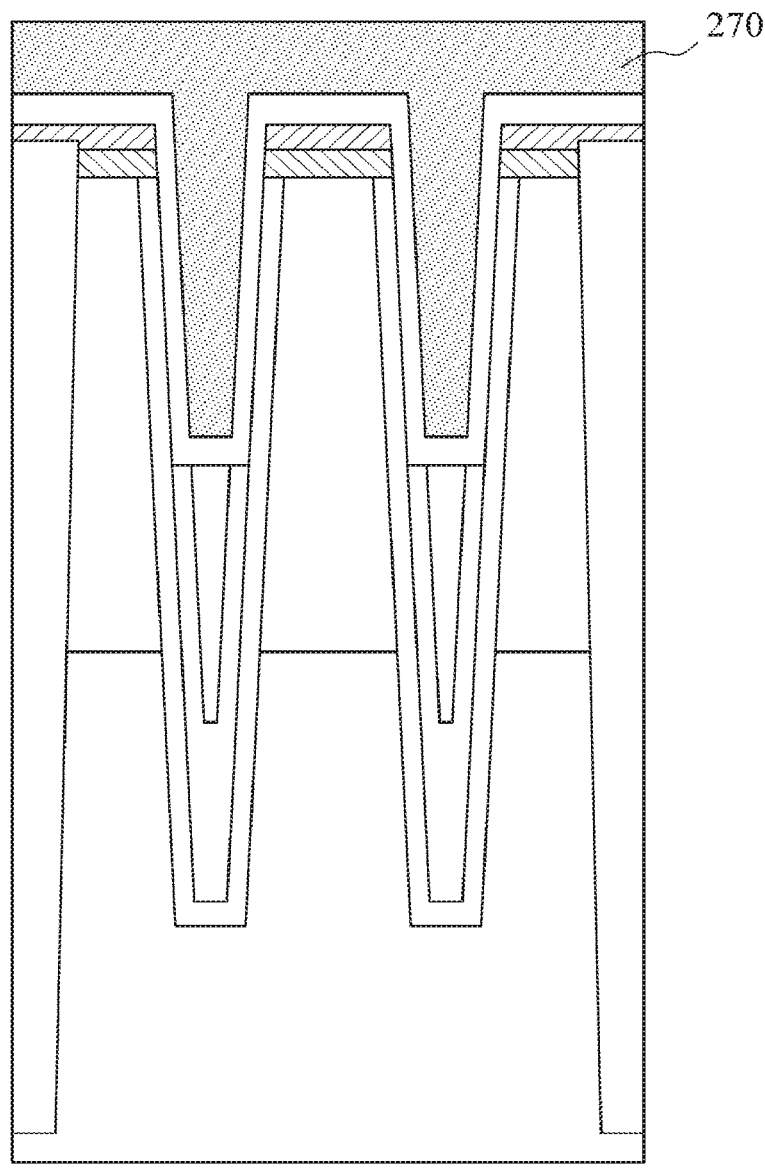
Figure 2C:
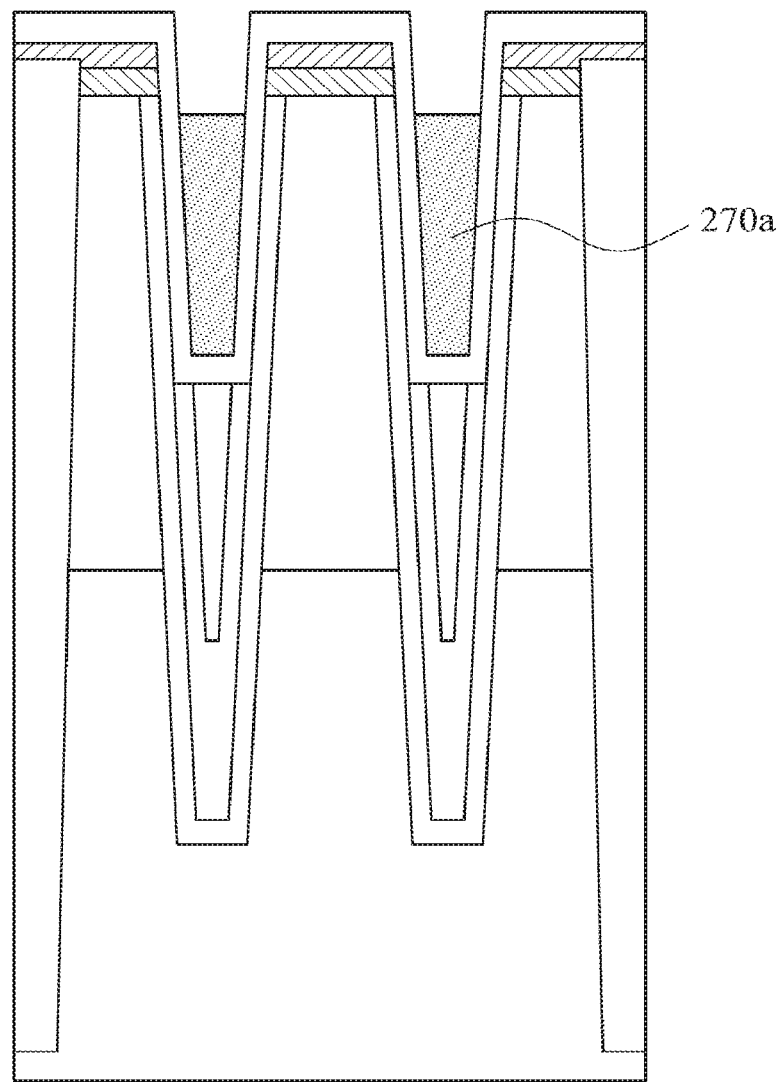
Figure 2D:
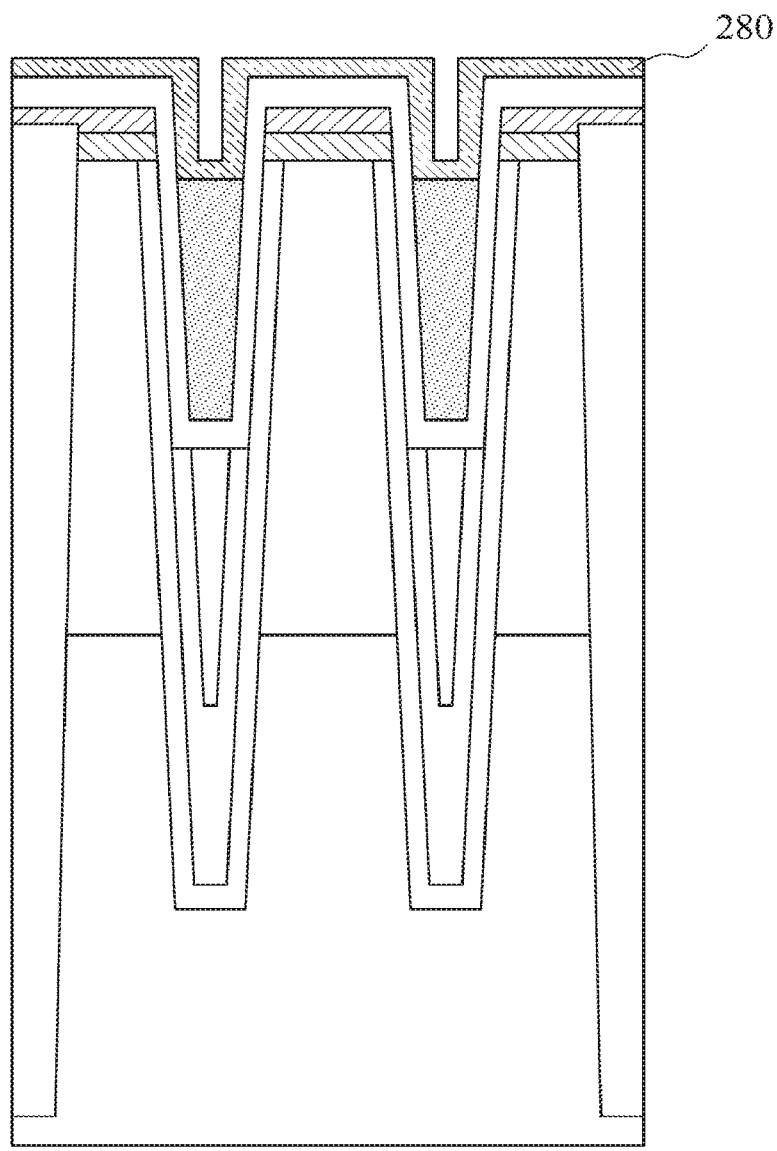
Figure 2E:
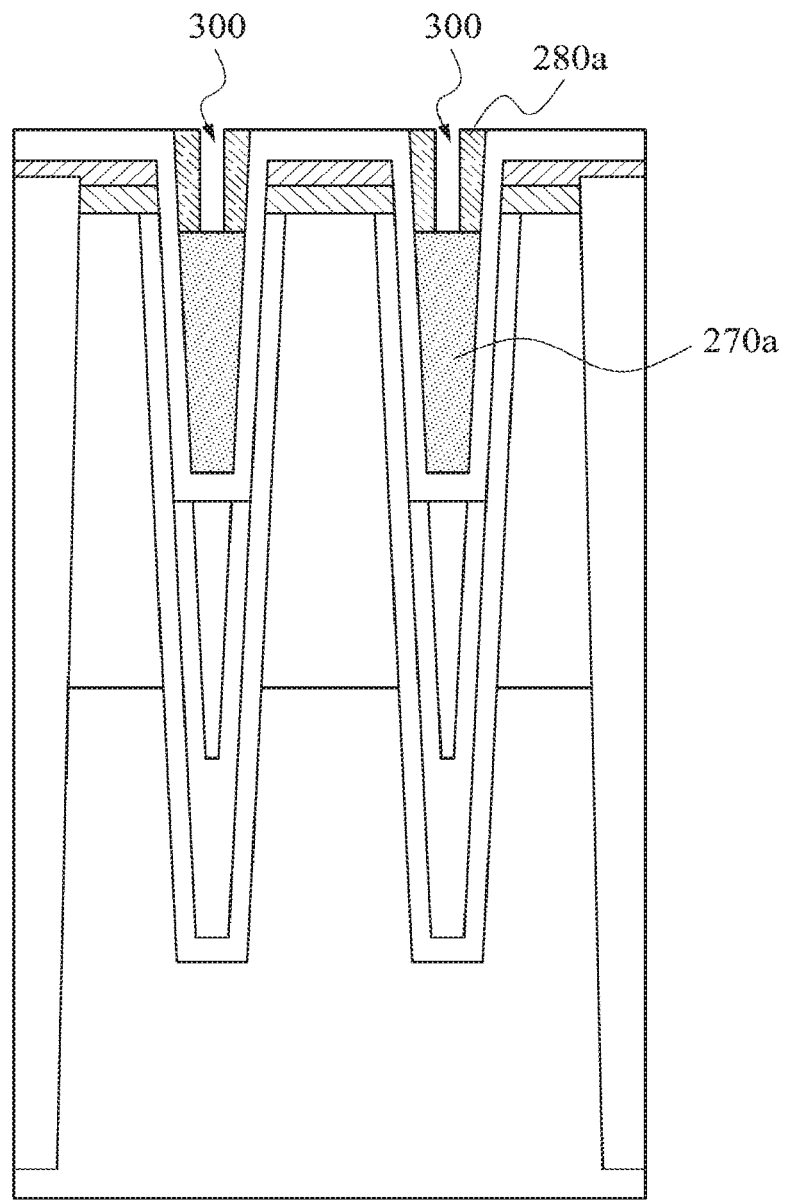
Figure 2F:
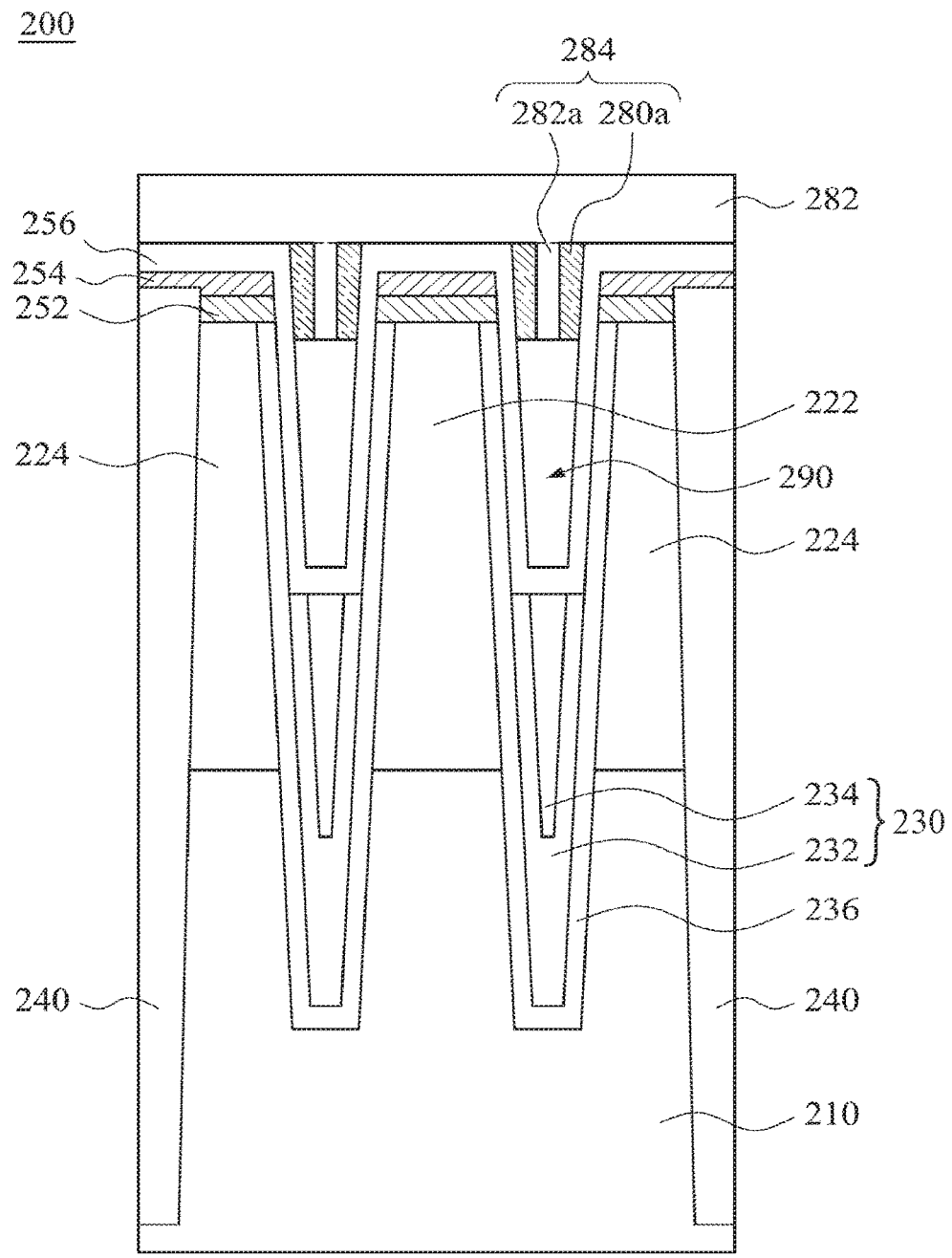

Referring to FIG. 2A, a substrate 210 is first provided for the fabrication of the memory device 200 (see FIG. 2F). A first active region 222 and second active regions 224 are formed alternately in the substrate 210, and gate structures 230 are formed in the substrate 210 and between the first active region 222 and the second active regions 224. A gate dielectric layer 236 is formed between the gate structure 230 and the first active region 222 and between the gate structure 230 and the second active region 224. Isolation structures 240 are formed in the substrate 210, and the first active region 222, the second active regions 224, and the gate structures 230 are disposed between two of the isolation structures 240. A first oxide layer 252 and a second oxide layer 254 are deposited over the substrate 210. An oxide liner 256 is disposed over the gate structures 230 and the second oxide layer 254.

The first active region 222 and the second active region 224 may respectively function as a source and a drain of the memory device 200, or vice versa, and may be n-doped or p-doped, depending on actual requirements.

The gate structure 230 may be a single-layer structure or a multi-layer structure. As shown in FIG. 2A, the gate structure 230 includes a first portion 232 and a second portion 234 embedded in the first portion 232. Examples of the material of the first portion 232 and the second portion 234 may be referred to those exemplified for the first portion 132 and the second portion 134 of FIG. 1A. In some embodiments, the first portion 232 is made of titanium nitride, and the second portion 234 is made of tungsten.

In some embodiments, the gate structures 230 are formed by forming trenches in the substrate 210. Then, the first portions 232 and the second portions 234 of the gate structures 230 are formed by deposition in the bottom portions of the trenches. Accordingly, top surfaces of the gate structures 230 are lower than a top surface of the substrate 210. In some embodiments, the gate dielectric layer 236 is formed by deposition before forming the gate structures 230. The gate dielectric layer 236 may be made of any suitable dielectric material, such as oxide or nitride.

The oxide liner 256 is disposed over the second oxide layer 254 and the gate structures 230 to define recesses 260. The oxide liner 256 may be deposited by any suitable process, such as those exemplified above. In some embodiments, the oxide liner 256 is deposited accompanied by an etching process, which is used to remove excess oxide at corners of the recesses 260 due to different deposition rates, so as to prevent the corners from being bridged and to define the recesses 260.

Other features such as materials, forming manners, and functions of the substrate 210, the first active region 222, the second active regions 224, the gate structures 230, the gate dielectric layer 236, the isolation structures 240, the first oxide layer 252, the second oxide layer 254, may be referred to those exemplified for the counterparts of FIG. 1A.

Continuing in FIG. 2B, a sacrificial layer 270 is deposited over the oxide liner 256 and the gate structures 230 to fill the recesses 260. The sacrificial layer 270 may be deposited by any deposition process exemplified above, and a CMP process is optionally performed after the deposition. The material of the sacrificial layer 270 is different from that of the oxide liner 256 considering that the sacrificial layer 270 would be removed in the subsequent step, while not removing the oxide liner 256. Preferably, the sacrificial layer 270 would be removed by a process having high selectivity of the material of the sacrificial layer 270 to oxide, which is the material of the oxide liner 256. In some embodiments, the sacrificial layer 270 is made of organic compound, nitride or photoresist. The photoresist is a light-sensitive material, such as polymeric resin.

Referring to FIG. 2C, the sacrificial layer 270 is etched to leave sacrificial structures 270a over the oxide liner 256 and the gate structures 230. The sacrificial layer 270 may be etched by any suitable process, such as dry etch and wet etch.

Continuing in FIG. 2D, a capping liner 280 is deposited over the oxide liner 256 and the sacrificial structures 270a. The capping liner 280 may be deposited by any deposition process exemplified above, and may be made of oxide.

Referring to FIG. 2E, the capping liner 280 is etched to form first parts 280a of capping layers 284. Each first part 280a of the capping layer 284 has an opening 300, and is over the sacrificial structure 270a. In some embodiments, the capping liner 280 is etched by a dry etching process.

Continuing in FIG. 2F, the sacrificial structures 270a are removed, and a nitride layer 282 is deposited over the oxide liner 256 and fills the openings 300. Portions of the nitride layer 282 that fill the openings 300 are second parts 282a of the capping layers 284, and are defined by dotted lines as shown in FIG. 2F. The first parts 280a of the capping layer 284 are interposed by the second part 282a of the capping layer 284. Accordingly, the capping layers 284 are formed, and voids 290 are defined. In some embodiments, the first parts 280a of the capping layer 284 are made of oxide, and the second part 282a of the capping layer 284 is made of nitride.

In some embodiments, the sacrificial structures 270a are removed by wet etching or photoresist stripping depending on the material of the sacrificial structures 270a. The nitride layer 282 may be formed by any suitable deposition process, such as those exemplified above. A CMP process may be optionally performed after the deposition. In some embodiments, the material of nitride layer 282 is silicon nitride (SiN).

The formed memory device 200 includes the substrate 210, the first active region 222, the second active regions 224, the gate structures 230, the gate dielectric layer 236, the isolation structures 240, the first oxide layer 252, the second oxide layer 254, the oxide liner 256, the capping liner 280, the capping layers 284, and the voids 290. The first active region 222 and the second active regions 224 are alternately disposed in the substrate 210. The gate structures 230 are disposed in the substrate 210 and between the first active region 222 and the second active regions 224, and include the first portion 232 and the second portion 234 embedded in the first portion 232. The gate dielectric layer 236 is deposited between the gate structure 230 and the first active region 222 and between the gate structure 230 and the second active region 224. The isolation structures 240 are disposed in the substrate 210, and the first active region 222, the second active regions 224, and the gate structures 230 are disposed between two of the isolation structures 240. The first oxide layer 252 and the second oxide layer 254 are disposed over the substrate 210. The oxide liner 256 is disposed over the second oxide layer 254 and the gate structures 230. The capping layers 284 are disposed over the gate structures 230 and the oxide liner 256 to define the voids 290, and each of which includes the first part 280a and the second part 282a interposing the first part 280a. The nitride layer 282 is disposed over the capping layers 284 and the second oxide layer 254.

The difference between the embodiments shown in FIGS. 2A through 2F and FIGS. 1A through 1D is the methods of forming the voids 180 and 290. This difference does not affect the functions of other components and steps in the embodiments. Therefore, the memory device 200 and the fabricating method thereof have the same functions and advantages as the memory device 100 shown in FIGS. 1A through 1D.

The embodiments of the present disclosure discussed above have advantages over existing memory devices and processes, and the advantages are summarized below. The memory device of the present disclosure is a novel structure, which applies a void as the cap for the gate structure to replace the dielectric material used in a general structure. As a result, the electrical potential coupling between the active regions can be effectively reduced, and lower electrical potential can get cell junction electrical and GIDL improvement. Further, the void with gaseous material provides better stress relax function than a general structure filled with solid material. Accordingly, the performance of the memory device can be improved.

It is noteworthy that the foregoing operating sequences for the method of fabricating the memory device are merely examples and are not intended to be limiting, and various changes, substitutions, and alterations may be made without departing from the spirit and scope of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of operating a memory device, the method comprising:

transmitting a current between a first active region and a second active region through a channel extending around a portion of a gate structure; and electrically isolating the first active region from the second active region around another portion of the gate structure with a sealed void located above the gate structure, wherein the sealed void is at least partially defined by a capping material located vertically over the gate structure and extending from the first active region to the second active region, the capping material sealing a space between the gate structure and the capping material.

2. The method of claim 1, wherein electrically isolating the first active region from the second active region comprises the sealed void being at least partially defined by a liner and a horizontal portion of the capping material extending between opposing portions of the liner, each of the liner and the horizontal portion of the capping material comprising an oxide.

3. The method of claim 1, wherein transmitting the current between the first active region and the second active region comprises transmitting the current between the first active region comprising one of an n-type dopant or a p-type dopant and the second active region comprising the other of the n-type dopant or the p-type dopant.

4. The method of claim 1, wherein transmitting the current comprises applying the current to a multi-layer gate structure including a first portion and a second portion embedded in the first portion.

5. The method of claim 1, wherein electrically isolating the first active region from the second active region comprises reducing electrical potential coupling between upper portions of each of the first active region and the second active region with the sealed void.

6. The method of claim 5, wherein reducing the electrical potential coupling between the upper portions of each of the first active region and the second active region comprises the sealed void comprising a gaseous material having a dielectric constant of about 1.

7. The method of claim 5, wherein reducing the electrical potential coupling between the upper portions of each of the first active region and the second active region comprises the sealed void being a vacuum.

8. A method of operating a memory device, the method comprising:
applying a bias to a gate structure of a memory cell;
extending a channel around a portion of the gate structure; and
conducting a current between a first active region and a second active region through the channel, wherein conducting the current between the first active region and the second active region comprises electrically isolating the first active region from the second active region with a sealed void located above the gate structure, the sealed void at least partially defined by a capping material located vertically over the gate structure and extending from the first active region to the second active region to seal a space between the gate structure and the capping material.

9. The method of claim 8, wherein conducting the current between the first active region and the second active region through the channel comprises separating the channel from the gate structure with a dielectric material located between the gate structure and each of the first active region and the second active region.

10. The method of claim 8, wherein electrically isolating the first active region from the second active region comprises reducing electrical potential coupling between upper portions of each of the first active region and the second active region with the sealed void being located laterally therebetween.

11. The method of claim 8, wherein extending the channel around the portion of the gate structure comprises extending the channel in a substrate surrounding at least a portion of the gate structure, the gate structure being recessed within the substrate.

12. The method of claim 8, further comprising providing electrical isolation between two adjacent memory cells of the memory device with shallow trench isolation structures comprising a dielectric material located adjacent the second active region.

13. The method of claim 8, wherein conducting the current between the first active region and the second active region through the channel comprises conducting the current between a source region and a drain region of the memory device.

14. A method of operating a dual-gate system, the method comprising:
receiving at least one input with the dual-gate system;
conducting a current between a central active region and two opposing active regions located laterally adjacent to the central active region;
transmitting the current through two opposing channels extending around lower portions of two gate structures located between the central active region and respective opposing active regions;
electrically isolating the central active region from the two opposing active regions with sealed voids located above the two gate structures, wherein each of the sealed voids is at least partially defined by a capping material located vertically over each of the two gate structures and extending from the central active region to the respective opposing active regions, the capping material sealing spaces between the two gate structures and the capping material; and
producing at least one output with the dual-gate system responsive at least in part to transmitting the current through the two opposing channels.

15. The method of claim 14, wherein transmitting the current through the two opposing channels extending around the lower portions of the two gate structures comprises transmitting the current through a substrate, the two gate structures being located in the substrate with top portions of the two gate structures being lower than a top surface of the substrate.

16. The method of claim 14, wherein electrically isolating the central active region from the two opposing active regions with the sealed voids comprises reducing electrical potential coupling between the central active region and each of the two opposing active regions to enhance gate-induced drain leakage performance of the dual-gate system.

17. The method of claim 14, further comprising applying a voltage difference between the central active region and at least one of the two opposing active regions to induce the current flowing therebetween.

18. The method of claim 14, wherein transmitting the current through the two opposing channels comprises each of the two gate structures having a first portion and a second portion above the first portion.

19. The method of claim 14, further comprising electrically isolating the dual-gate system from adjacent dual-gate systems with isolation structures laterally adjacent each of the two opposing active regions, each of the two opposing active regions located between one of the two gate structures and a respective isolation structure.

20. The method of claim 19, wherein electrically isolating the dual-gate system from the adjacent dual-gate systems with the isolation structures comprises a depth of each of the isolation structures being greater than a depth of each of the two gate structures.

* * * * *

UNITED STATES PATENT AND TRADEMARK OFFICE
CERTIFICATE OF CORRECTION

PATENT NO. : 10,424,583 B2
APPLICATION NO. : 16/027598
DATED : September 24, 2019
INVENTOR(S) : Tieh-Chiang Wu Page 1 of 1

It is certified that error appears in the above-identified patent and that said Letters Patent is hereby corrected as shown below:

In the Specification
Column 1, Line 9, change "Jul. 10, 2018 which" to --Jul. 10, 2018, which--

Signed and Sealed this
Twelfth Day of November, 2019

Andrei Iancu
*Director of the United States Patent and Trademark Office*